US 9,263,987 B2

(12) United States Patent
Bao

(10) Patent No.: US 9,263,987 B2
(45) Date of Patent: Feb. 16, 2016

(54) OSCILLATOR CIRCUIT

(75) Inventor: Mingquan Bao, Vastra Frolunda (SE)

(73) Assignee: OPTIS CELLULAR TECHNOLOGY, LLC, Plano, TX (US)

( * ) Notice: Subject to any disclaimer, the term of this patent is extended or adjusted under 35 U.S.C. 154(b) by 196 days.

(21) Appl. No.: 13/264,573

(22) PCT Filed: Apr. 20, 2009

(86) PCT No.: PCT/EP2009/054668
§ 371 (c)(1),
(2), (4) Date: Oct. 14, 2011

(87) PCT Pub. No.: WO2010/121644
PCT Pub. Date: Oct. 28, 2010

(65) Prior Publication Data
US 2012/0032746 A1 Feb. 9, 2012

(51) Int. Cl.
*H03B 5/08* (2006.01)
*H03B 5/18* (2006.01)

(52) U.S. Cl.
CPC ........................................ *H03B 5/18* (2013.01)

(58) Field of Classification Search
CPC .............. H03B 5/06; H03B 5/18; H03B 5/32; H03B 5/36; H03B 2200/0008; H03B 5/326; H03B 5/362; H03B 5/38; H03B 2201/0208; H03B 5/366

USPC ............ 331/158, 116 R, 116 FE, 167, 117 R, 331/117 FE
See application file for complete search history.

(56) References Cited

U.S. PATENT DOCUMENTS

| 4,749,964 A * | 6/1988 | Ash ............................ 331/107 A |
| 6,294,964 B1 * | 9/2001 | Satoh ......................... 331/116 R |
| 6,683,507 B2 * | 1/2004 | Jeong ......................... 331/117 R |

FOREIGN PATENT DOCUMENTS

EP          1926207 A1         5/2008

* cited by examiner

*Primary Examiner* — Arnold Kinkead
(74) *Attorney, Agent, or Firm* — Vincent J. Allen; James H. Ortega; Carstens & Cahoon, LLP

(57) ABSTRACT

An oscillator circuit (100, 200, 300, 10, 11) comprising a resonator (105) connected serially with a series to series feedback amplifier (110, 92), in which the series to series amplifier comprises a feedback network (210, 91) which has an impedance value which is below a certain first predefined limit and a phase value which increases with the operational frequency of the oscillator circuit with a rate which is above a second predefined limit. In one embodiment, the impedance value of the feedback network (210, 91) also varies with the operational frequency of the oscillator circuit, but is always below said first predefined value within the operational frequency of the oscillator circuit.

20 Claims, 7 Drawing Sheets

OSCILLATOR CIRCUIT

CROSS REFERENCE TO RELATED APPLICATION(S)

This application is a 35 U.S.C. §371 National Phase Entry Application from PCT/EP2009/054668, filed Apr. 20, 2009, designating the United States, the disclosure of which is incorporated herein in its entirety by reference.

TECHNICAL FIELD

The present invention discloses a novel oscillator circuit.

BACKGROUND

A local oscillator, LO, for use as a signal source is an important building block in many communications systems and radar systems. In an LO, a low phase noise is often needed in order to achieve a high performance of the overall system in which the LO is comprised.

Examples of oscillator technologies that are often used in LOs are Radio Frequency Integrated Circuits (RFIC) oscillators, and Monolithic Microwave integrated Circuits (MMIC) oscillators. For both RFIC and MMIC oscillators, their phase noise performance is limited mainly by the quality factor Q of an on-chip resonator which is comprised in the oscillator. The resonator will often comprise a varactor or a fixed capacitor, as well as an inductor.

Attempts have been made to address the issue of phase noise in LOs. These attempts have mainly concentrated on improving the Q-factor of the resonator's inductor. However, at higher frequencies, for example at frequencies above 20 GHz, these attempts have not been as successful as would have been desired.

Document EP 1 926 207 A1 discloses an oscillator circuit which comprises a fine tuning network, a coarse tuning network and a dynamically tuned dual coupled resonator network.

SUMMARY

Thus, there is a need for a solution by means of which an oscillator such as a LO can be given a reduced phase noise at higher frequencies, such as frequencies above 20 GHz.

Such a solution is offered by the present invention in that it discloses an oscillator circuit which comprises a resonator which is connected in parallel to a first and a second port of a series to series feedback amplifier, with a third and a fourth port of the series to series amplifier being connectable to ground.

The series to series amplifier comprises a feedback network which has an absolute value of impedance (later it will be called as an impedance value) which is below a certain first predefined limit and a phase value which increases with the operational frequency of the oscillator circuit with a rate which is above a second predefined limit.

A suitable example of the predefined limit which the impedance value should be below is 10 ohms, and a suitable example of the predefined limit which the rate of increase of the phase value should be above is 25 degrees/GHz.

As will be described in more detail below, the oscillator circuit of the invention offers a solution with improved phase noise performance.

In one embodiment, the impedance value of the feedback network also varies with the operational frequency of the oscillator circuit, but within the operational frequency of the oscillator circuit it is still below the first predefined limit.

In one embodiment, the series to series amplifier of the oscillator circuit of the invention comprises a Field Effect Transistor, a FET, and in one embodiment it comprises a bipolar transistor.

In one embodiment of the oscillator circuit of the invention, the resonator has a fixed oscillation frequency.

In one embodiment of the oscillator circuit of the invention, the resonator has an oscillation frequency which is tuneable within a certain range.

These and other embodiments and their advantages will be described in more detail below.

BRIEF DESCRIPTION OF THE DRAWINGS

The invention will be described in more detail in the following, with reference to the appended drawings, in which.

DETAILED DESCRIPTION

Figure 1:
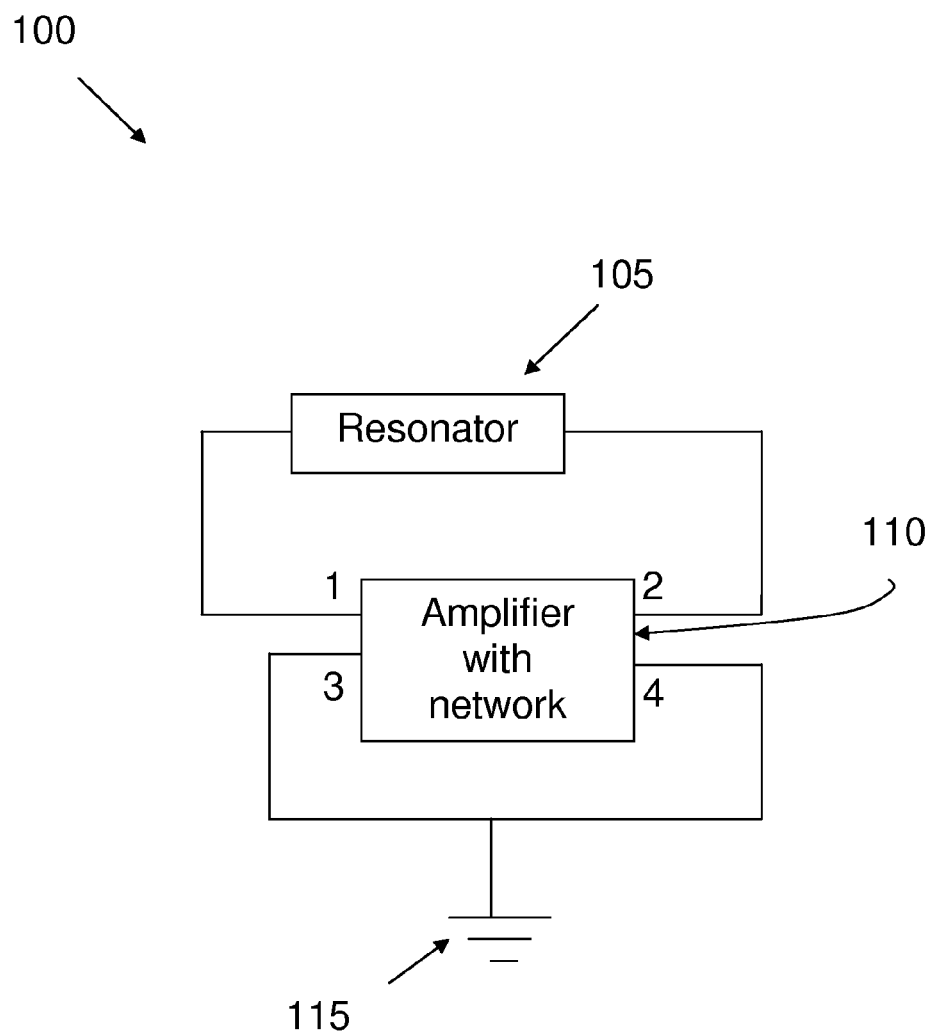
FIG. 1 shows a first embodiment of a circuit of the invention.

FIG. 1 shows a basic embodiment of an oscillator circuit 100 of the invention. As shown, the oscillator circuit 100 comprises a resonator 105 which is connected in parallel to a first and a second port, 1, 2, of a so called series to series feedback amplifier 110 which comprises a feedback network. A third and fourth port, 3, 4 of the amplifier are, in the example shown in FIG. 1, used for connection to ground 115

Examples of the resonator 105, the amplifier 110 and the feedback network will be shown later in this text. As pointed out, when in use, the circuit oscillator 100 is suitably connected to ground 115 via two of the ports 3, 4 of the feedback network in the series to series amplifier 110.

As mentioned initially, a purpose of the present invention is to obtain an oscillator circuit with improved phase noise performance. In the amplifier 110, the so called effective trans-conductance, here denoted as $g_{\it{eff}}$, is a function of frequency, as given by the following expression:

$$g_{\it{eff}} = \frac{g_m}{1 + g_m Z_s(\omega)} \quad (1)$$

where $g_m$ is the amplifier's trans-conductance and $Z_s(\omega)$ is the impedance of the feedback network. It should be noted that the impedance, $Z_s(\omega)$, is a complex value, consisting of an impedance value and a phase value.

The impedance, $Z_s(\omega)$, of the feedback network has, according to the invention, a phase value which increases with frequency, $\omega$, which causes the effective trans-conductance, $g_{eff}$, to have a phase value which is a decreasing function of frequency, $\omega$, see equation (1) above.

The feedback network of the invention is designed so that the phase characteristic of the geff of the amplifier will be similar to that of the resonator 105. If the resonator 105 and the amplifier 100 is seen as a loop, the loop gain, $G_{loop}(\omega)$, is given by:

$$G_{loop}(\omega) = Z_t(\omega) * g_{eff}(\omega) \quad (2)$$

where $Z_t(\omega)$ is the so called trans-impedance of the resonator 105. If, for example, a transistor is used as the amplifier 110, then $Z_t(\omega)$ is given by the expression:

$$Z_t(\omega) = V_{gate}/I_{drain} \quad (3)$$

where $V_{gate}$ and $I_{drain}$ represent the AC voltage at the gate/base of the transistor (depending on the kind of transistor which is used), and the AC current at the drain/collector of the transistor (also depending on the kind of transistor which is used).

From (2), it can be seen that the phase of the loop gain will be the sum of the phase values of $Z_t(\omega)$ and $g_{eff}(\omega)$, here denoted as $\phi$.

The so called phase slope of the loop gain, $G_{loop}(\omega)$, is defined as the magnitude of the expression:

$$\left| \frac{\partial \phi}{\partial \omega} \right| \quad (4)$$

As follows from the expressions above, the phase slope of the loop gain will increase in the presence of the feedback network, since the phase values of both $Z_t(\omega)$ and $g_{eff}(\omega)$ decrease as the operational frequency of the oscillator circuit of the invention frequency increases. As a consequence of this, the phase noise of the oscillator circuit 100, which is proportional to the phase slope of the loop gain, will decrease.

Figure 2:
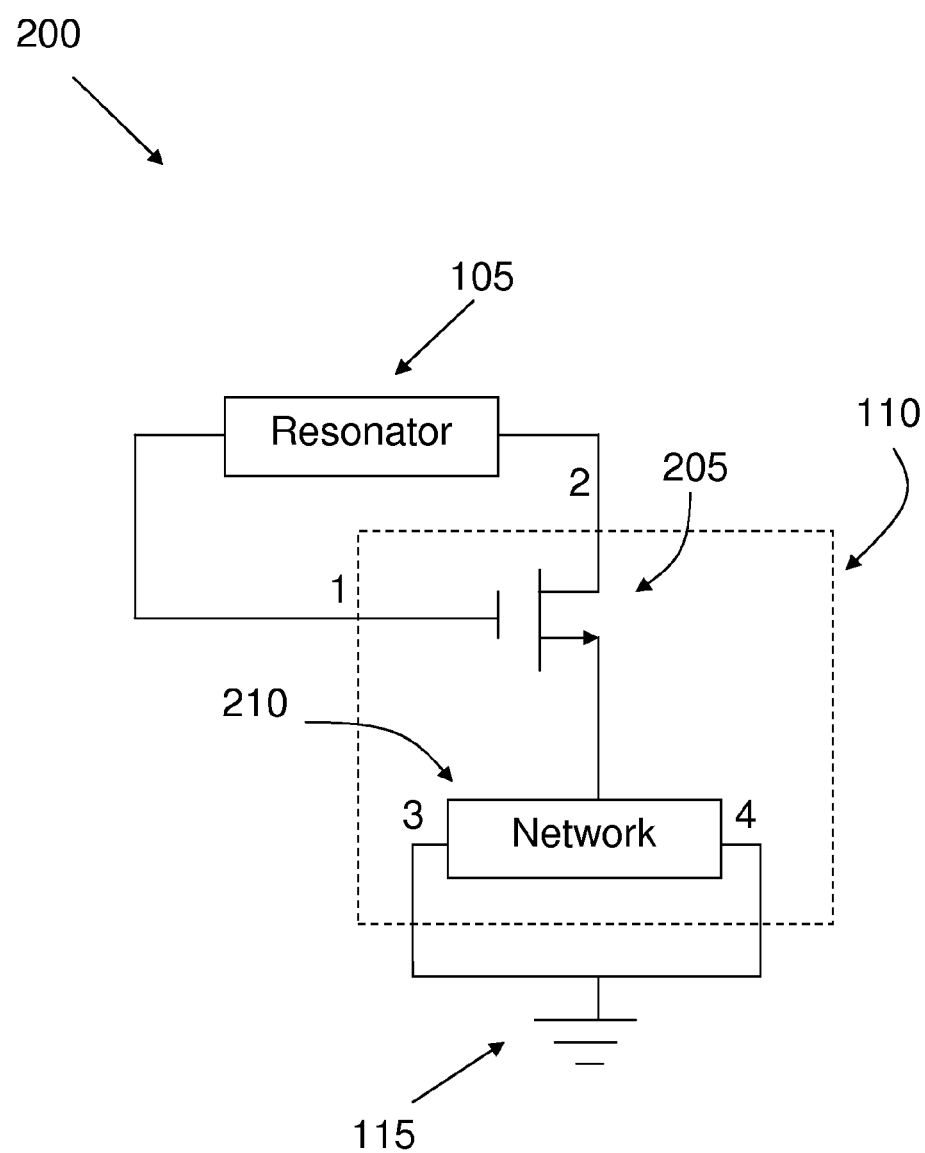
FIGS. 2 and 3 show second and third embodiments of the invention.

FIG. 2 shows one embodiment of an oscillator circuit 200 of the invention. Components which are similar to those of FIG. 1 have retained their reference numbers in FIG. 2. As shown in FIG. 2, the amplifier of the embodiment 200 comprises a FET-transistor 205, with its drain and gate connected in a "loop" with the resonator 105 via ports 1 and 2, while the source of the FET 205 is connected to ground 115 via the feedback network 210 via the ports 3 and 4.

Figure 3:
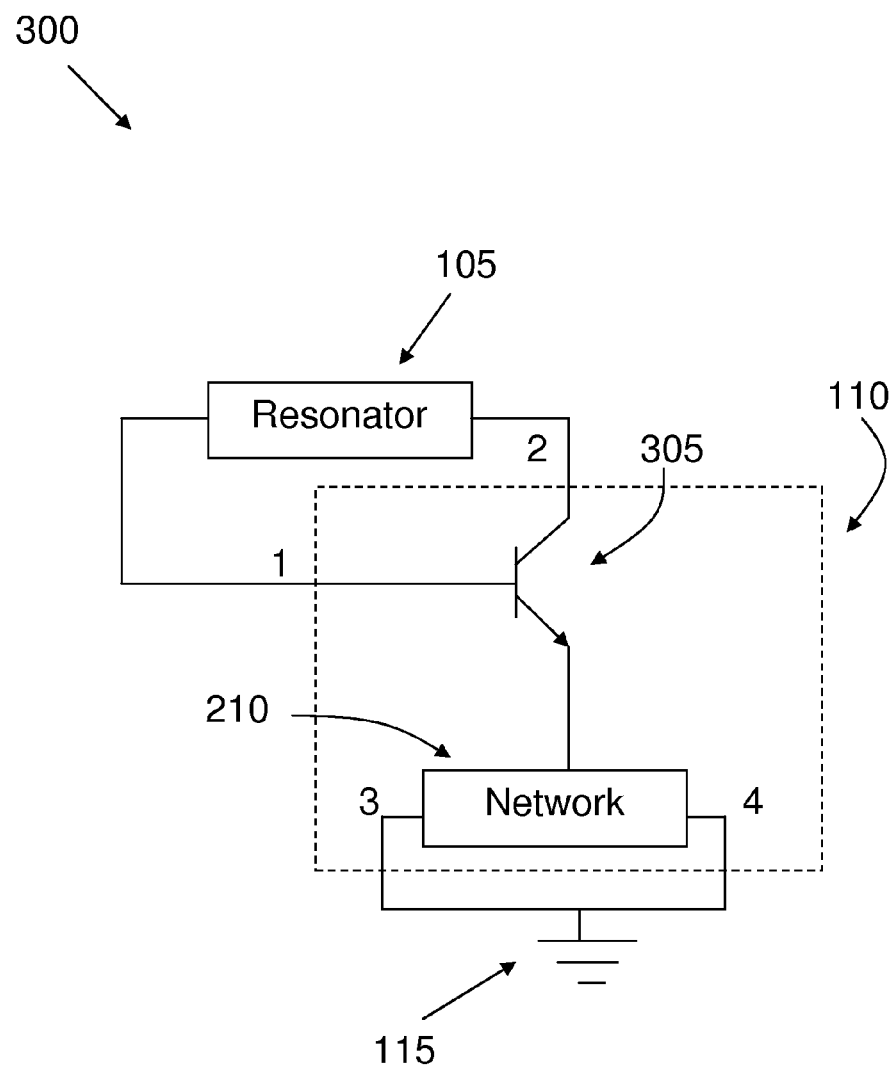

FIG. 3 shows another embodiment of an oscillator circuit 300 of the invention. Components which are similar to those of FIG. 1 have retained their reference numbers in FIG. 3. As shown in FIG. 3, the amplifier of the embodiment 300 comprises a bipolar transistor 305, with its base and collector connected in a "loop" with the resonator 105, while the emitter of the transistor 305 is connected to ground 115 via the feedback network 210.

The circuit of the invention will be described below as comprising a FET-transistor in the amplifier, but it should be pointed out that this is by way of example only; the amplifier can equally well comprise a bipolar transistor. In addition, it should also be pointed out that the transistors shown in FIGS. 2 and 3 and in the following are also only examples of series to series feedback amplifiers; as is well known to those skilled in the field, such amplifiers can be designed in a large number of ways, all of which are within the scope of this invention.

It should be pointed out that the circuits of FIGS. 1-3 are shown as so called "simplified AC schematics", i.e. without DC-biasing, since those skilled in the field will know how to add DC-bias to a circuit.

Turning now to the feedback network used in the oscillator circuit of the invention, such a network can also be designed in a large number of ways, but a number of examples will be given in the following. As mentioned, desired characteristics of the feedback network used in the invention are that the feedback network should have a low impedance value, i.e. below a predefined limit and a phase value which increases with the operational frequency of the oscillator circuit with a rate which is above a second predefined limit.

Although the limits mentioned above for the impedance value and the rate of the increase of the phase value are design parameters which can be varied within the scope of the invention, a suitable example of the predefined limit which the impedance value should be below is 10 ohms, and a suitable example of the predefined limit which the rate of the increase of the phase value should be above is 25 degrees/GHz.

Figure 4:
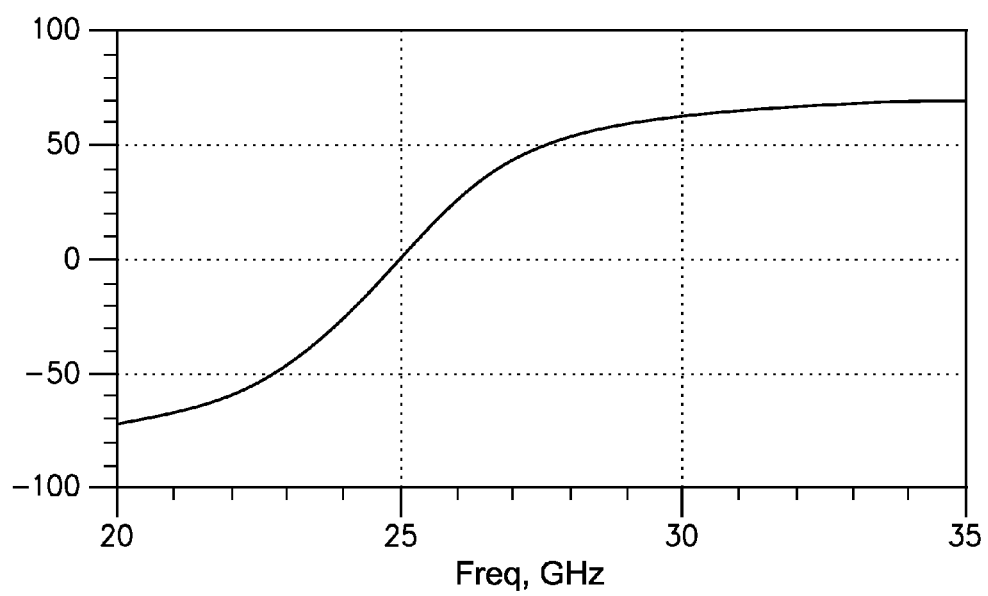
FIG. 4 shows impedance phase as a function of frequency for a component.

One example of a circuit which can be used as such as feedback network in the circuit of the invention is a quarter wavelength transmission line with one terminal open. Phase as a function of frequency for such a circuit is shown in FIG. 4. As can be seen, within a certain frequency range, approximately 23-28 GHz, the phase of the circuit increases rapidly with the frequency. The magnitude or impedance value of the quarter wavelength transmission line can be designed so that it is at a desired low level, for example in the range of 1-10 ohms.

Figure 5A:
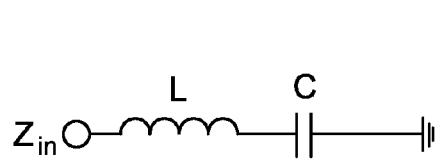
FIGS. 5a and 5b show circuits for use in the invention.
Figure 5B:
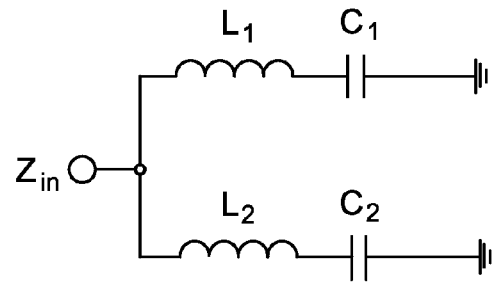
Figure 6:
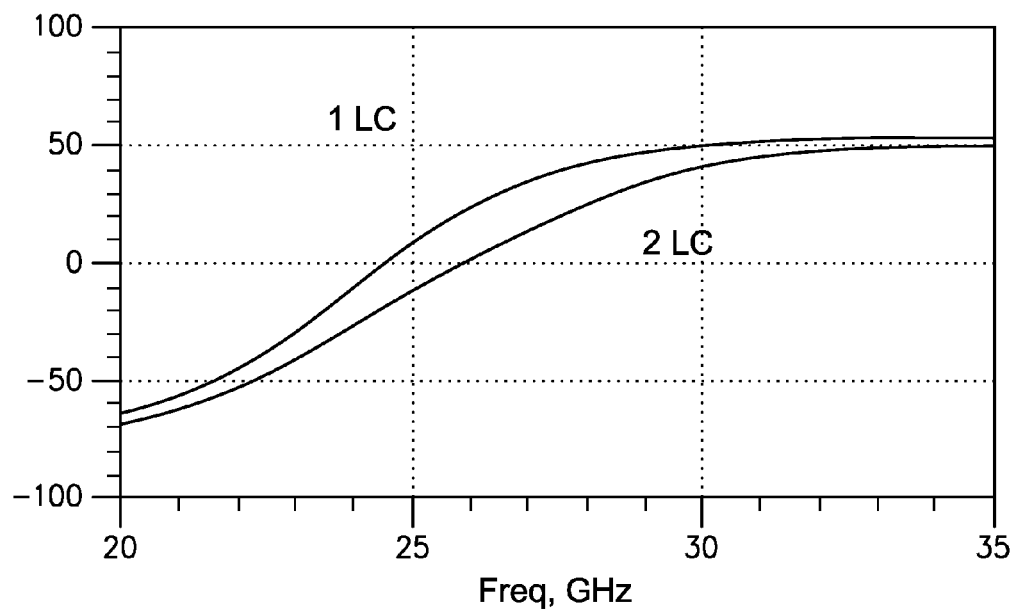
FIG. 6 shows impedance phase as a function of frequency for other components.

Another example of how a feedback network for use in the invention can also be designed is by means of combinations of inductors and capacitors, for example a series connected inductor and capacitor circuit, as shown in FIG. 5a. The phase behaviour of this circuit as a function of frequency is shown in FIG. 6 as "1 LC". FIG. 5b shows a circuit with two LC lines such as the one shown in FIG. 5a connected in parallel, which is another possibility for a feedback network to be used in the invention. The phase behaviour of the circuit of FIG. 5b is shown in FIG. 6 as "2 LC".

It should be noted that both LC lines such as those of FIGS. 5a and 5b and quarter wavelength transmission lines have a resonance frequency $\omega_0$ at which the phase is zero and the phase slope is at a maximum, so that the impedance value is at a minimum.

The oscillator circuit of the invention can be designed to either have a fixed oscillation frequency, or to have a tuneable oscillation frequency within a certain range. In the case of a fixed frequency oscillator circuit, the resonance frequency $\omega_0$ of the feedback network should essentially coincide with the oscillation frequency. In the case of a tuneable frequency oscillator, the resonance frequency $\omega_0$ of the feedback network should be located essentially in the middle of the tuneable range, since at this frequency, the circuit will get it sharpest decline in phase noise.

As an alternative to the LC circuits shown in FIGS. 5a and 5b, the fixed capacitor C (or one or both of them, in FIG. 5b) could be replaced with a varactor, for example so called off-chip high Q ferroelectric varactors.

Figure 7:
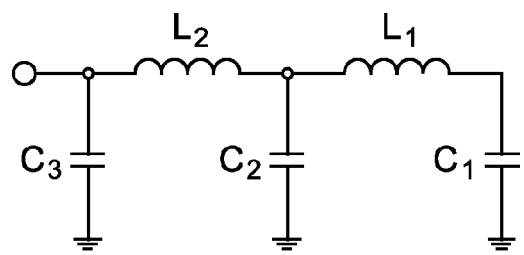
FIG. 7 illustrates an example feedback network.

Another alternative for the feedback network is shown in FIG. 7, which shows a network consisting of inductors L1, L2, and capacitors, C1, C2, C3. Such a network essentially has a function similar to that of the circuit shown in FIG. 5b, i.e. it basically corresponds to two parallel LC lines.

Figure 8:
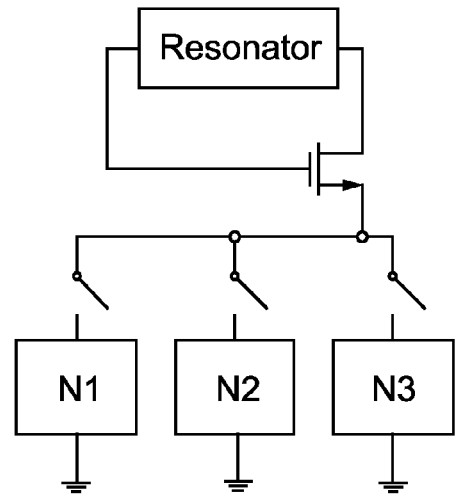
FIG. 8 illustrates yet another alternative for a feedback network.
Figure 9A:
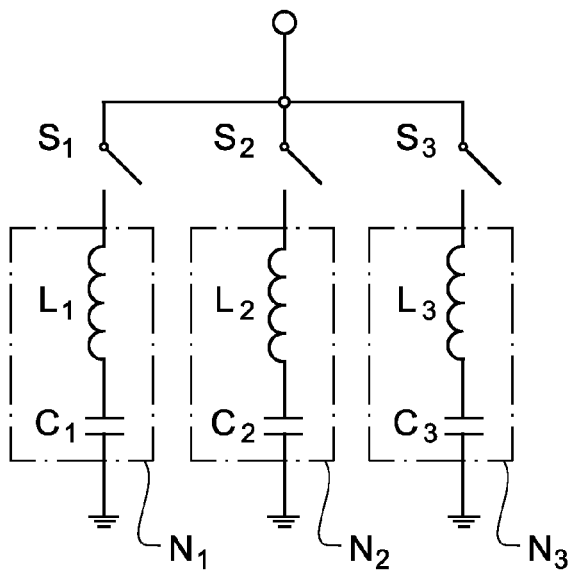
FIG. 9a shows a circuit design.

As yet another alternative for a feedback network to be used in the invention, multiple switched networks can be used, as shown symbolically in FIG. 8. For each sub range of the resonator's frequency, one of the networks "Net 1-3" is connected to the resonator, while the other networks are disconnected from the resonator. FIG. 9a shows a circuit design with three such networks, N1, N2, N3, with each network being a pair of serially connected inductors and capacitors, L1-C1, L2-C2, L3-C3, i.e. series connected LC circuits with different $$\omega_i = 1/\sqrt{L_i C_i}, (i = 1, 2, 3 \ldots)$$

distributed over the whole frequency range of the oscillator circuit.

As also shown in FIGS. 8 and 9*a*, if a plurality of networks N1-N3 is used, there should also be a switch S1-S3 for each network in order to enable each network to be connected or disconnected to the rest of the oscillator circuit, as the operational frequency of the oscillator circuit varies. The connection or disconnection of the switches S1-S3 can, for example, be carried out by a (not shown) control component in the oscillator circuit.

Figure 9B:
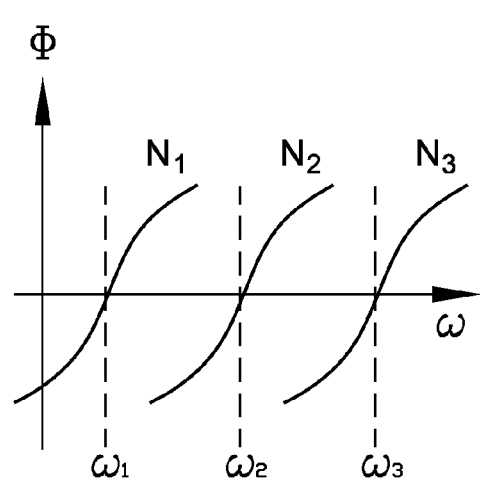
FIG. 9b shows the phase of each of three networks of FIG. 9a as a function of frequency.

FIG. 9*b* shows the phase φ of each of the three networks N1, N2, N3, of FIG. 9*a* as a function of frequency, ω, with a centre frequency ω1, ω2, ω3 being shown for each network, where ωN is defined as $$\omega_N = 1/\sqrt{L_N C_N}, (i = 1, 2, 3 \ldots).$$

It should be pointed out that the proposed feedback network of the oscillator circuit can be implemented either on-chip or off-chip. An off-chip network can be built on a microwave circuit board, and is superior to on-chip ones due to a higher Q-factor.

Figure 10:
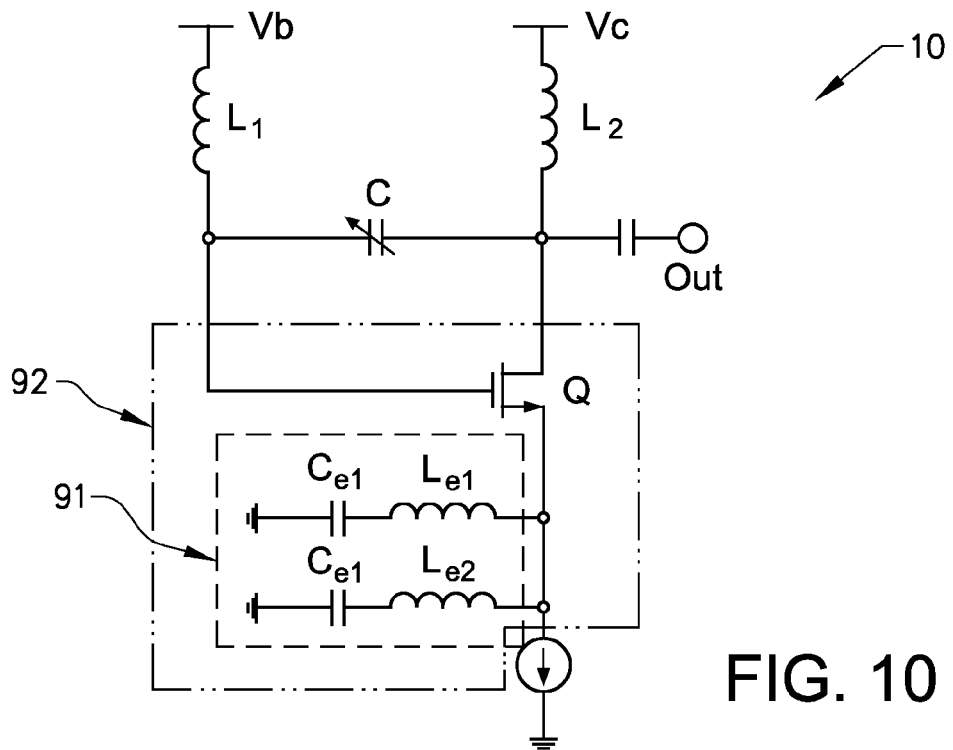
FIG. 10 shows an example oscillator circuit.

FIG. 10 shows an example of an oscillator circuit 10 of the invention, with the output of the oscillator 10 shown as "Out". The oscillator circuit 10 is based on a so called Hartley VCO, with an amplifier 92 which comprises a feedback network 91. In the example of FIG. 10, the resonator consists of two inductors $L_1$ and $L_2$ as well as a varactor C, and the amplifier 92 comprises a FET transistor Q, with the resonator being connected between the transistor's gate and drain. At the FET's source, the feedback network 91 (two parallel LC circuits) is connected, in order to improve the oscillators phase noise performance. As is also shown in FIG. 10, the circuit 10 comprises bias inputs Vb and Vc for the FET's gate and drain, respectively.

In another embodiment, if the inductors $L_1$ and $L_2$ of the embodiment 10 of FIG. 10 are replaced by capacitors $C_1$ and $C_2$, respectively, and the varactor C is replaced by an inductor L, a so called Colpitts' oscillator (VCO) will be obtained. A Colpitts' oscillator has a so called differential output, for which reason there are two output ports shown in FIG. 11, "Out+" and Out−", i.e. positive and negative outputs of the output signal of the oscillator 11. The feedback network 91 shown in FIG. 10 can be used in such a VCO (Colpitts') as well.

Figure 11:
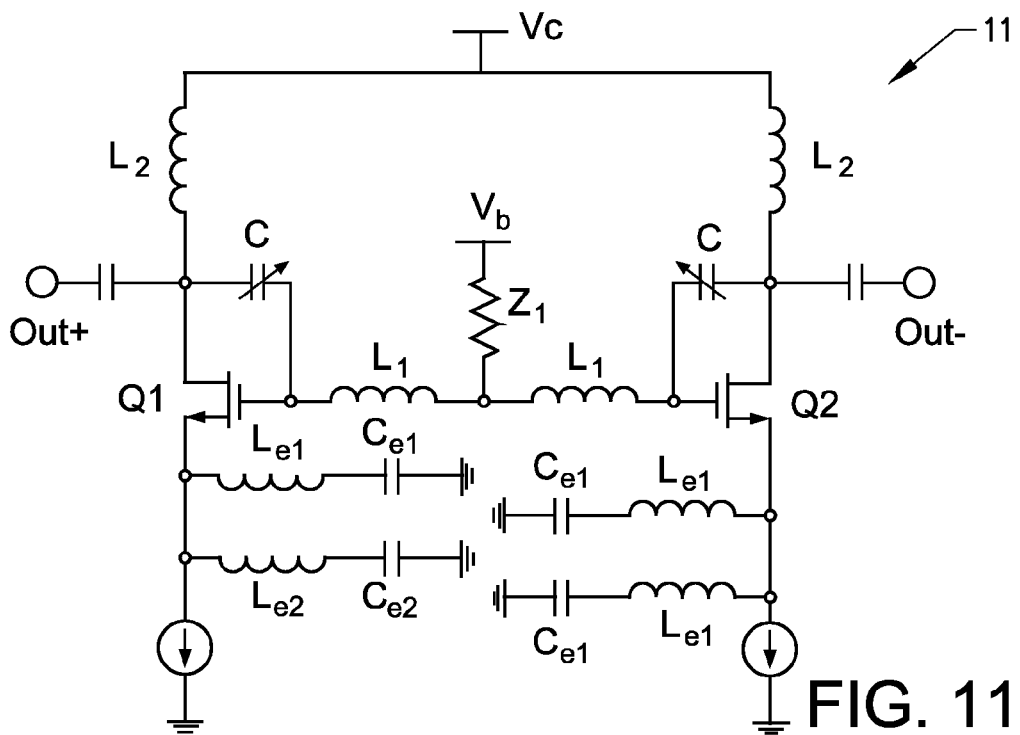
FIG. 11 shows a further example of an oscillator circuit.

FIG. 11 shows a further example of an oscillator circuit 11 of the invention. The oscillator circuit 11 is based on two so called Hartley VCOs, in which two FETs, Q1 and Q2 are connected to each other via their respective gates, by means of inductors L1 and L'1, between which there is arranged an impedance Z1, connected to a port for—base bias Vb.

Each of the two Hartley VCOs which are comprised in the circuit 11 is also connected to a feedback network 91, 91', which in this example comprises two series LC circuits connected in parallel with each other from the source of the FET to ground.

In conclusion, a number of unique features are obtained by means of the invention, such as:
1. Phase noise reduction is realized by enhancing the phase slope of the loop gain in order to deal with the problem of low Q for on-chip resonators.
2. The feedback network has specified features; i.e., its impedance's phase is an increasing function of the frequency; the magnitude is small.
3. The feedback network is connected to the source/emitter (depending on the use of a FET or a bipolar transistor), and the resonator is connected between the transistor's gate and drain. Thus, the feedback network and the resonator are separated by the transistor.
4. For a fixed frequency oscillator, the feedback network's resonance frequency can be made equal to the oscillating frequency.
5. For a voltage controlled oscillator, several types of feedback networks can be used in order to cover the whole frequency tuning range, including using switched networks.
6. The feedback network can be implemented either on- or off-chip. If it is implemented in a microwave circuit board (off-chip), it can be connected to an on-chip VCO circuit via either bonding wire or flip-chip assembly process.

In addition, other advantages which are gained by means of the invention are:
1. Phase noise performance is improved, through the use of a low Q resonator.
2. Due to the small magnitude of the impedance, the feedback network will cause a very small increase in the DC power consumption of the circuit.
3. Since the resonator and the feedback network are separated by an amplifier, such as for example, a transistor, the resonator loading by the network is minimized, and thus, the feedback network itself will not contribute to a deterioration of the resonator's Q.
4. The invention allows flexibility in building the feedback network either on- or off-chip. The advantage of off-chip networks over the on-chip ones is that high Q components are available and will save high-cost chip area. The implementation on a microwave circuit board is quite easy.
5. The oscillator of the invention can be implemented in any semiconductor technology, e.g. Silicon, GaAs, and can be implemented in CMOS and FET, as well as in bipolar technologies The invention is not limited to the examples of embodiments described above and shown in the drawings, but may be freely varied within the scope of the appended claims.

the invention claimed is:

1. An oscillator circuit, comprising;
a resonator connected in parallel to a first and a second port of a feedback amplifier, with a third and a fourth port of the feedback amplifier being connectable to ground,
wherein the feedback amplifier comprises:
at least one amplifier element comprising the first, second, and third ports, and
a feedback network comprising the fourth port and being connected to the amplifier element via the third port, the third and fourth ports being physically decoupled from the first port,
wherein the feedback network has an absolute impedance value that is below a certain first predefined limit and a phase value that increases with the operational frequency of the oscillator circuit with a rate that is above a second predefined limit, and wherein the resonator has a fixed oscillation frequency and the feedback network has a resonance frequency which is essentially equal to the oscillation frequency of the resonator.

2. The oscillator circuit of claim 1, in which the absolute impedance value of the feedback network also varies with the operational frequency of the oscillator circuit, but is always below said first predefined value within the operational frequency of the oscillator circuit.

3. The oscillator circuit of claim 1, in which the first predefined limit for the absolute impedance value is 10 ohms, and the second predefined limit for the rate of the increase of the phase value is 25 degrees/GHz.

4. The oscillator circuit of any of claim 1, comprising a plurality of switchable networks.

5. The oscillator circuit of claim 1, wherein the at least one amplifier element comprises a Field Effect Transistor.

6. The oscillator circuit of claim 1, wherein the at least one amplifier element comprises a bipolar transistor.

7. The oscillator circuit of claim 1, wherein the feedback amplifier further comprises a transistor and the feedback network comprises a first inductor and a first capacitor, and wherein:
a first terminal of the first inductor is directly connected to a terminal of the transistor,
a second terminal of the first inductor is directly connected to a first terminal of the first capacitor, and
a second terminal of the first capacitor is directly connected to ground.

8. The oscillator circuit of claim 7, wherein the feedback network further comprises a second inductor and a second capacitor, wherein:
a first terminal of the second inductor is directly connected to said terminal of the transistor,
a second terminal of the second inductor is directly connected to a first terminal of the second capacitor, and
a second terminal of the second capacitor is directly connected to ground.

9. The oscillator circuit of claim 7, wherein the feedback network further comprises a second inductor and a second capacitor, wherein:
a first terminal of the second inductor is directly connected to said second terminal of the first inductor,
a second terminal of the second inductor is directly connected to a first terminal of the second capacitor, and
a second terminal of the second capacitor is directly connected to ground.

10. The oscillator circuit of claim 9, wherein the feedback network further comprise a third capacitor, wherein:
a first terminal of the third capacitor is directly connected to said terminal of the transistor, and
a second terminal of the third capacitor is directly connected to ground.

11. An oscillator circuit, comprising:
a resonator connected in parallel to a first and a second port of a feedback amplifier, with a third and a fourth port of the feedback amplifier being connectable to ground,
wherein the feedback amplifier comprises:
at least one amplifier element comprising the first, second, and third ports, and
a feedback network comprising the fourth port and being connected to the amplifier element via the third port, the third and fourth ports being physically decoupled from the first port,
wherein the feedback network has an absolute impedance value that is below a certain first predefined limit and a phase value that increases with the operational frequency of the oscillator circuit with a rate that is above a second predefined limit, wherein the feedback network is connected in parallel to the first and a third port of the feedback amplifier, and
wherein the resonator has an oscillation frequency which is tuneable within a certain range and the feedback network has a resonance frequency which is essentially equal to the oscillation frequency of the resonator.

12. The oscillator circuit of claim 11, in which the absolute impedance value of the feedback network also varies with the operational frequency of the oscillator circuit, but is always below said first predefined value within the operational frequency of the oscillator circuit.

13. The oscillator circuit of claim 11, in which the first predefined limit for the absolute impedance value is 10 ohms, and the second predefined limit for the rate of the increase of the phase value is 25 degrees/GHz.

14. The oscillator circuit of claim 13, in which the feedback network has a resonance frequency which is located essentially in the middle of the resonator's tuneable range.

15. The oscillator circuit of any of claim 11, comprising a plurality of switchable networks.

16. The oscillator circuit of claim 11, wherein the at least one amplifier element comprises at least one of a Field Effect Transistor or a bipolar transistor.

17. The oscillator circuit of claim 11, wherein the feedback amplifier further comprises a transistor and the feedback network comprises a first inductor and a first capacitor, and wherein:
a first terminal of the first inductor is directly connected to a terminal of the transistor,
a second terminal of the first inductor is directly connected to a first terminal of the first capacitor, and
a second terminal of the first capacitor is directly connected to ground.

18. The oscillator circuit of claim 17, wherein the feedback network further comprises a second inductor and a second capacitor, wherein:
a first terminal of the second inductor is directly connected to said terminal of the transistor,
a second terminal of the second inductor is directly connected to a first terminal of the second capacitor, and
a second terminal of the second capacitor is directly connected to ground.

19. The oscillator circuit of claim 11, wherein the feedback network further comprises a second inductor and a second capacitor, wherein:
a first terminal of the second inductor is directly connected to said second terminal of the first inductor,
a second terminal of the second inductor is directly connected to a first terminal of the second capacitor, and
a second terminal of the second capacitor is directly connected to ground.

20. The oscillator circuit of claim 19, wherein the feedback network further comprise a third capacitor, wherein:
a first terminal of the third capacitor is directly connected to said terminal of the transistor, and
a second terminal of the third capacitor is directly connected to ground.

* * * * *

UNITED STATES PATENT AND TRADEMARK OFFICE
CERTIFICATE OF CORRECTION

PATENT NO. : 9,263,987 B2
APPLICATION NO. : 13/264573
DATED : February 16, 2016
INVENTOR(S) : Bao Page 1 of 1

It is certified that error appears in the above-identified patent and that said Letters Patent is hereby corrected as shown below:

On the title page, item 75, under "Inventor", in Column 1, Line 1, delete "Vastra Frolunda" and insert -- Västra Frölunda --, therefor.

In the specification

In Column 2, Lines 19-20, delete "invention, and" and insert -- invention. --, therefor.

In Column 2, Line 22, delete "invention, and" and insert -- invention. --, therefor.

In Column 2, Line 24, delete "component, and" and insert -- component. --, therefor.

In Column 2, Line 25, delete "invention, and" and insert -- invention. --, therefor.

In Column 2, Line 27, delete "component, and" and insert -- component. --, therefor.

In Column 5, Line 22, delete "ωN" and insert -- $\omega_N$ --, therefor.

In Column 5, Line 25, delete "($i$=1, 2, 3....)" and insert -- (N=1, 2, 3...) --, therefor.

In Column 5, Line 53, delete ""Out-"," and insert -- "Out-", --, therefor.

In the claims

In Column 7, Line 14, in Claim 4, delete "of any of" and insert -- of --, therefor.

In Column 8, Line 24, in Claim 15, delete "of any of" and insert -- of --, therefor.

Signed and Sealed this
Thirty-first Day of May, 2016

Michelle K. Lee
*Director of the United States Patent and Trademark Office*